US009887701B1

(12) United States Patent
Schoch

(10) Patent No.: US 9,887,701 B1
(45) Date of Patent: Feb. 6, 2018

(54) FREQUENCY OFFSET CORRECTION PRECISION OF REAL-TIME CLOCKS

(71) Applicant: Texas Instruments Deutschland GMBH, Freising (DE)

(72) Inventor: Andreas Michael Schoch, Moosburg an der Isar (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 0 days.

(21) Appl. No.: 15/261,898

(22) Filed: Sep. 10, 2016

(51) Int. Cl.
*H03K 21/00* (2006.01)
*H03K 23/40* (2006.01)

(52) U.S. Cl.
CPC .................................. *H03K 23/40* (2013.01)

(58) Field of Classification Search
None
See application file for complete search history.

(56) References Cited

U.S. PATENT DOCUMENTS

| 7,652,545 B2* | 1/2010 | Yang | G06F 1/14 331/158 |
| 2010/0318311 A1* | 12/2010 | Nguyen | H03F 3/19 702/107 |
| 2016/0233852 A1* | 8/2016 | Ali | H03K 3/017 |

\* cited by examiner

*Primary Examiner* — Long Nguyen
(74) *Attorney, Agent, or Firm* — John R. Pessetto; Charles A. Brill; Frank D. Cimino

(57) ABSTRACT

In described examples, an apparatus includes: a counter configured to receive a reference clock signal and having a next state input and a current state output; a multiplexer coupled to the next state input of the counter, configured to output one of an incremented next state value and a corrected next state count value responsive to a count correction select control signal; a seconds reference circuit coupled to the current state output of the counter, configured to output a seconds reference signal; an incrementer coupled to the current state output of the counter, configured to output the incremented next state value; and a calibration compensation circuit coupled to a compensate up down input signal and to the current state output of the counter, configured to output the corrected next state count value and the count correction select control signal.

20 Claims, 9 Drawing Sheets

FREQUENCY OFFSET CORRECTION PRECISION OF REAL-TIME CLOCKS

TECHNICAL FIELD

This application relates generally to digital circuits, and more particularly to real-time clock circuits with frequency offset correction.

BACKGROUND

Real-time clocks (RTCs) are widely used in electronic equipment where the date and time of day or other uses of time and calendar data are critical to the effective use of the equipment. Examples include personal computers and smartphones where the year, month, day, and time of day data are important to the functionality of these devices. In addition, other types of electronic devices utilize RTCs for time and potentially calendar data such as automotive displays, programmable home thermostats, and industrial equipment. Many of these systems require that the RTC continue operation (typically utilizing a battery) while the full system (such as a personal computer or automobile electronics) is either powered off or in a sleep or stand-by mode.

SUMMARY

In described examples, an apparatus includes: a counter configured to receive a reference clock signal and having a next state input and a current state output; a multiplexer coupled to the next state input of the counter, configured to output one of an incremented next state value and a corrected next state count value responsive to a count correction select control signal; and a seconds reference circuit coupled to the current state output of the counter, configured to output a seconds reference signal. The apparatus further includes an incrementer coupled to the current state output of the counter, configured to output the incremented next state value; and a calibration compensation circuit coupled to a compensate up down input signal and to the current state output of the counter, configured to output the corrected next state count value and the count correction select control signal.

DETAILED DESCRIPTION OF EXAMPLE EMBODIMENTS

Figure 1:
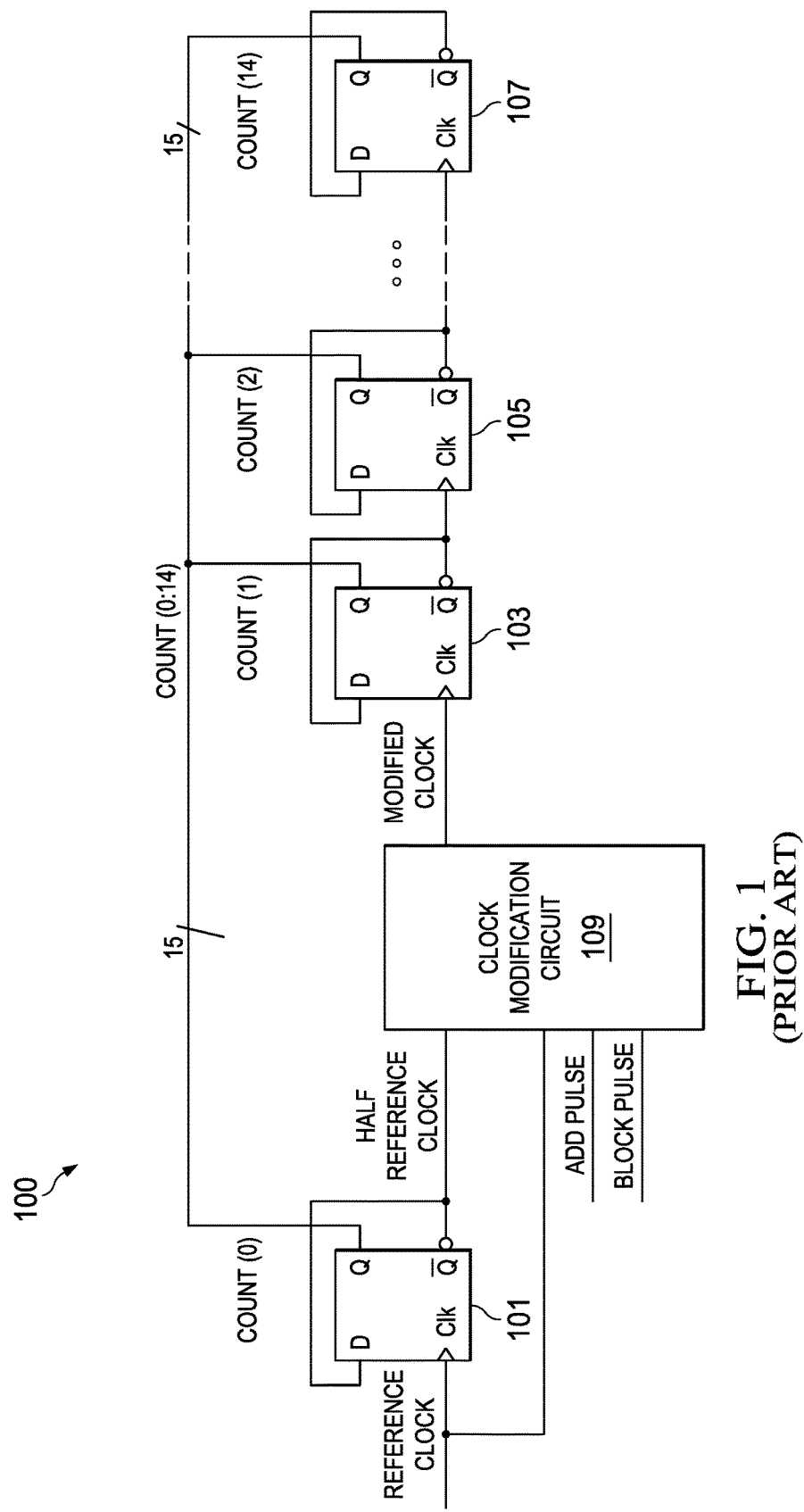
FIG. 1 is a block diagram illustrating a portion of a conventional RTC.

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figures herein that illustrate timing diagrams are drawn such that time scales for all signal traces within an individual figure are approximately the same. The time scales for the traces within an individual timing diagram are approximately aligned vertically such that the approximately simultaneously occurring states of all signals illustrated in a figure are aligned vertically. The timing diagrams herein represent digital logic signals and are drawn with ideal transitions between states and without circuit delays. The only exception is that for bus signals a short transition time, not drawn to scale, is illustrated between bus states. All references to oscillator and clock frequencies and time periods herein are approximate, unless otherwise indicated.

Conventional RTCs typically employ an oscillator circuit that resonates at a frequency that is stable and known. The oscillator outputs a constant frequency signal within a tolerance based on characteristics of circuit elements, operating conditions, manufacturing variations, and other types of variations. A reference clock circuit converts the oscillator output signal to a stream of logic pulses at the same frequency as the oscillator; or, at a multiple of the output of the oscillator. In one example arrangement, the logic pulses clock a digital logic counter that divides the oscillator frequency to a lower frequency. For example, an RTC employing a common 32 KHz (32,768 Hz) crystal as the oscillator and a reference clock circuit that generates pulses at the approximate rate of 32,768 per second can generate an approximate 1 Hz clock signal. In this example, the reference clock circuit uses a 15-bit binary counter. (Numbers herein are decimal, base 10, unless otherwise indicated). A typical 15-bit binary counter clocked at approximately 32,768 Hz will reach its maximum count value of 32,767 and roll over to a count value of zero approximately once per second. To generate an event such as a logic pulse or edge transition approximately once per second (a frequency of approximately 1 Hz), a circuit is often employed to monitor the counter state such as the counter reaching the maximum count value.

The counter that divides the reference clock signal to a lower frequency as described hereinabove is commonly known as the "clock prescaler" of an RTC. RTCs with a prescaler output of approximately 1 Hz are often implemented with 1 minute counter enabled by the prescaler output, and a 1 hour counter enabled by the 1 minute counter output. RTCs may employ additional counters to clock longer time periods such as days and years. Examples of conventional RTCs may not have separate counters for some types of time periods. For example, a 16-bit counter for days spans more than 100 years. A counter for years may not be necessary in such a case, since the year can also be calculated based on the number of days that elapse from an initial date.

RTCs may be implemented to generate time information that is not related to traditional clock and calendar values (seconds, minutes, hours, days, etc.). A process control system that wakes up periodically to repeat a task may have no need for typical time and calendar data and instead requires an RTC that only maintains the wake up time interval.

The actual frequency of an RTC oscillator typically varies from the nominal crystal frequency (32,768 Hz in the above example). The difference between the nominal and actual frequency values (the "frequency offset") can result in significant time and calendar error accumulation over time. Frequency offset is likely to exist for any RTC oscillator. Conventional RTCs often employ a compensation circuit to compensate for frequency offset by generating additional clock pulses or by blocking clock pulses within the prescaler. The count is thus adjusted to make the correction.

The number of additional or the number of blocked reference clock pulses within a specific increment of time needed to partly correct the frequency offset can be determined by various methods, including one-time calibration during manufacturing or system setup. In addition, systems can be implemented with the functionality to partly correct frequency offset due to changing operating conditions on an on-going basis. For example, systems can employ a temperature sensor and contain oscillator characterization data of temperature vs. frequency offset. In such a case the system can be implemented with the functionality to adapt to temperature changes by modifying the number of clock pulses to add or block within a specific increment of time as the oscillator temperature changes.

The number of pulses to add or block within the prescaler is typically based on a time period greater than a second (such as one minute). The number of reference clock pulses to add or block within a one minute period for a specific RTC is the absolute value of the frequency offset in Hz multiplied by 60 seconds per minute. The determination to add or block reference clock pulses is based on the actual frequency being less or greater than the nominal frequency. For the case of the actual frequency being lower than the nominal frequency, adding the above number of pulses will approximately correct the frequency offset. For the case where the actual frequency is higher than the nominal frequency, blocking the above number of pulses will approximately correct the frequency offset. For example, in a case of an RTC with a nominally 32,768 Hz oscillator having an actual (measured) frequency of approximately 32,766.41 Hz, the frequency offset is approximately 1.59 Hz (32,768 Hz less 32.766.41), and the number of pulses to add in one minute is 95 (1.59 Hz multiplied by 60 seconds and rounded to an integer).

For systems that employ temperature compensation, the frequency offset is modified as the temperature changes as described hereinabove. Based on the modified frequency offset, the calculation of the number of pulses to block or add and the determination to add or block pulses can be repeated as the temperature changes. The determination of when to perform temperature compensation during system operation is dependent on system implementation.

The function of adding and blocking clock pulses can use a clock that is half the frequency of the RTC oscillator. For example, the 32 kHz reference clock signal in the above example can be used to generate a 16 kHz clock with a single flip-flop divider. The flip-flop that generates the 16 kHz clock is often the least significant prescaler bit. The higher order bits (all bits excluding the least significant bit) are clocked with the 16 KHz clock. For a case where pulses are added and blocked using a clock with half the frequency of the reference clock signal, the number of pulses to add or block is approximately half that of the calculation described hereinabove for reference clock modification.

FIG. 1 is a block diagram for a portion of an example conventional RTC. Circuit 100 is a 15-bit prescaler implemented with 15 D-type flip-flops and a clock modification circuit 109. The signal labeled "reference clock" is nominally a 32 kHz signal in the example of FIG. 1. The reference clock frequency is simply divided by flip-flop 101 to produce a 16 kHz clock labeled "half reference clock" in FIG. 1. Block 109 of FIG. 1 modifies the pulse stream of the half reference clock signal, outputting the modified pulse stream on the signal labeled "modified clock" in FIG. 1. When the signal labeled "block pulse" in FIG. 1 is a logic high and the signal labeled "add pulse" in FIG. 1 is a logic low, block 109 removes a pulse from the 16 kHz clock pulse stream. When the add pulse signal is a logic high and the block pulse signal is a logic low, block 109 inserts an additional pulse into the 16 kHz clock pulse stream. When both signals add pulse and block pulse are logic high or both logic low, the block 109 passes all pulses from the half reference clock signal to the modified clock signal (no clock modification). Flip-flops 101, 103, and 105 are the least significant 3 bits of the prescaler, and flip-flop 107 is the most significant bit of the prescaler. The remaining 11 flip-flops and interconnect are not illustrated, but are present as indicated by the series of dots shown between 105 and 107. Flip-flop 101 is the least significant prescaler bit and the divider for the reference clock signal. Following each active edge of the 32 kHz clock, the 15-bit prescaler state propagates to the 15 bit bus labeled "count (0:14)." The signals in FIG. 1 labeled "count (0)," "count (1)," "count (2)," and "count (14)" are the least significant, second least significant, third least significant, and most significant bits respectively of the value on the count (0:14) bus. The add pulse and block pulse signals are generated external to FIG. 1 by RTC circuitry (not shown) that implements the frequency offset correction function.

Conventional RTCs can include a reset signal for the prescaler which is not illustrated in FIG. 1 for simplicity of explanation.

Figure 2:
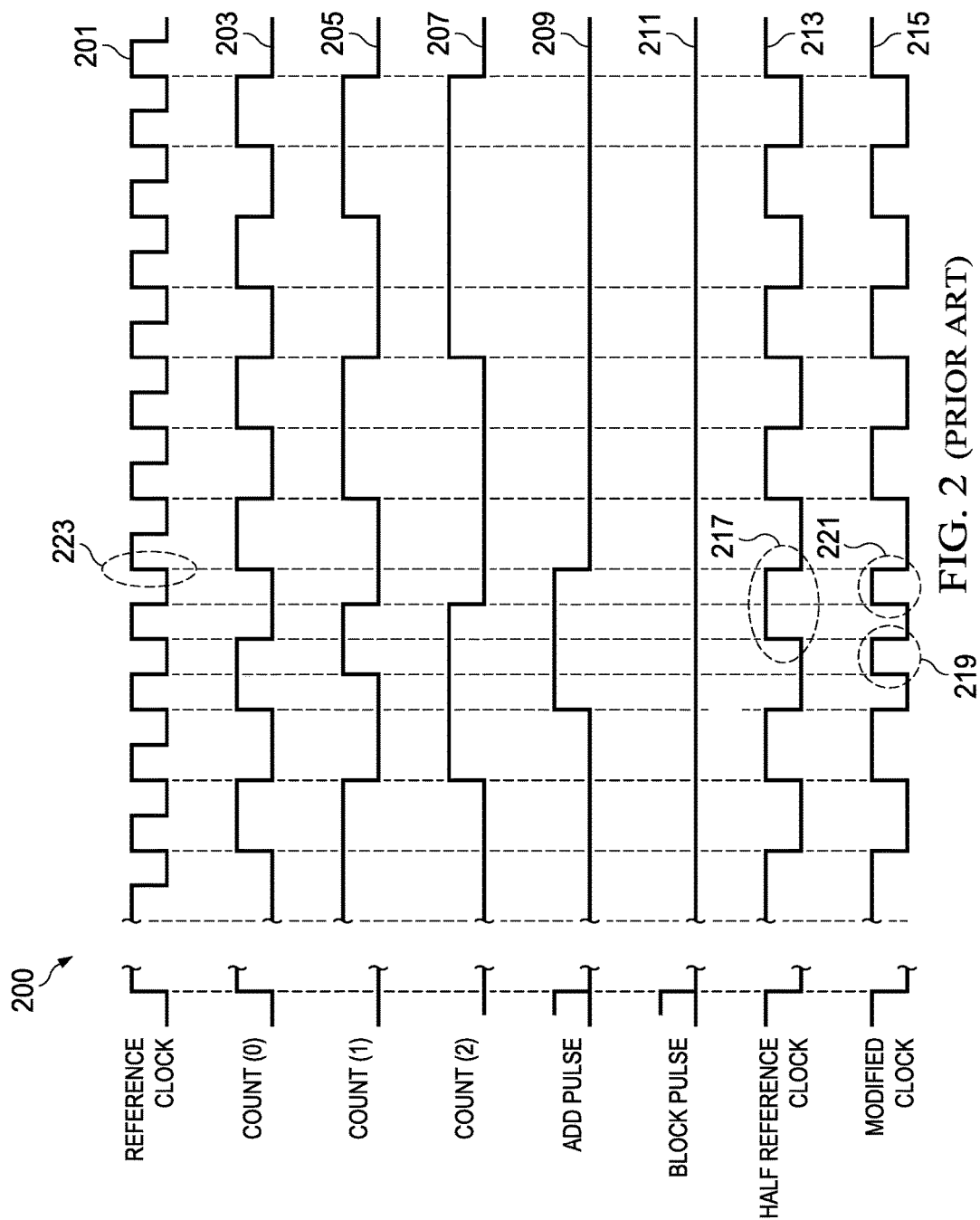
FIG. 2 is a timing diagram that illustrates the states of selected signals illustrated in FIG. 1 for the addition of a clock pulse.

FIG. 2 is a timing diagram 200 illustrating the states of selected signals of circuit 100 of FIG. 1. FIG. 2 illustrates a case where a clock pulse is added to the modified clock pulse stream. Trace 213 illustrates the half reference clock pulse stream generated by flip-flop 101 in FIG. 1. A circuit external to circuit 100 (see FIG. 1) generates the add pulse and the block pulse signals (traces 209 and 211 respectively in FIG. 2). The add pulse signal pulses to a logic high during the half reference clock cycle where the clock manipulation occurs (the block pulse signal is a logic low). The result is that clock modification circuit (block 109 of FIG. 1) removes a pulse (event 217 in FIG. 2) in trace 213 and inserts two shorter duration pulses (events 219 and 221 in FIG. 2) in the modified clock pulse stream (trace 215 in FIG. 2). The modified clock pulse stream provides clocking for the 14 most significant bits of the prescaler (illustrated in FIG. 1). The signals count (0), count (1), and count (3) of FIG. 1 (traces 203, 205, and 207 respectively of FIG. 2) depart from a normally monotonically increasing count pattern for two cycles of the reference clock signal (trace 201 of FIG. 2) due to the clock manipulation illustrated in trace 215 of FIG. 2. The normal counting pattern is restored at event 223 in FIG. 2 with the count value having been incremented by two (when compared to what the value would have been at event 223 without the clock manipulation illustrated in trace 215).

Figure 3:
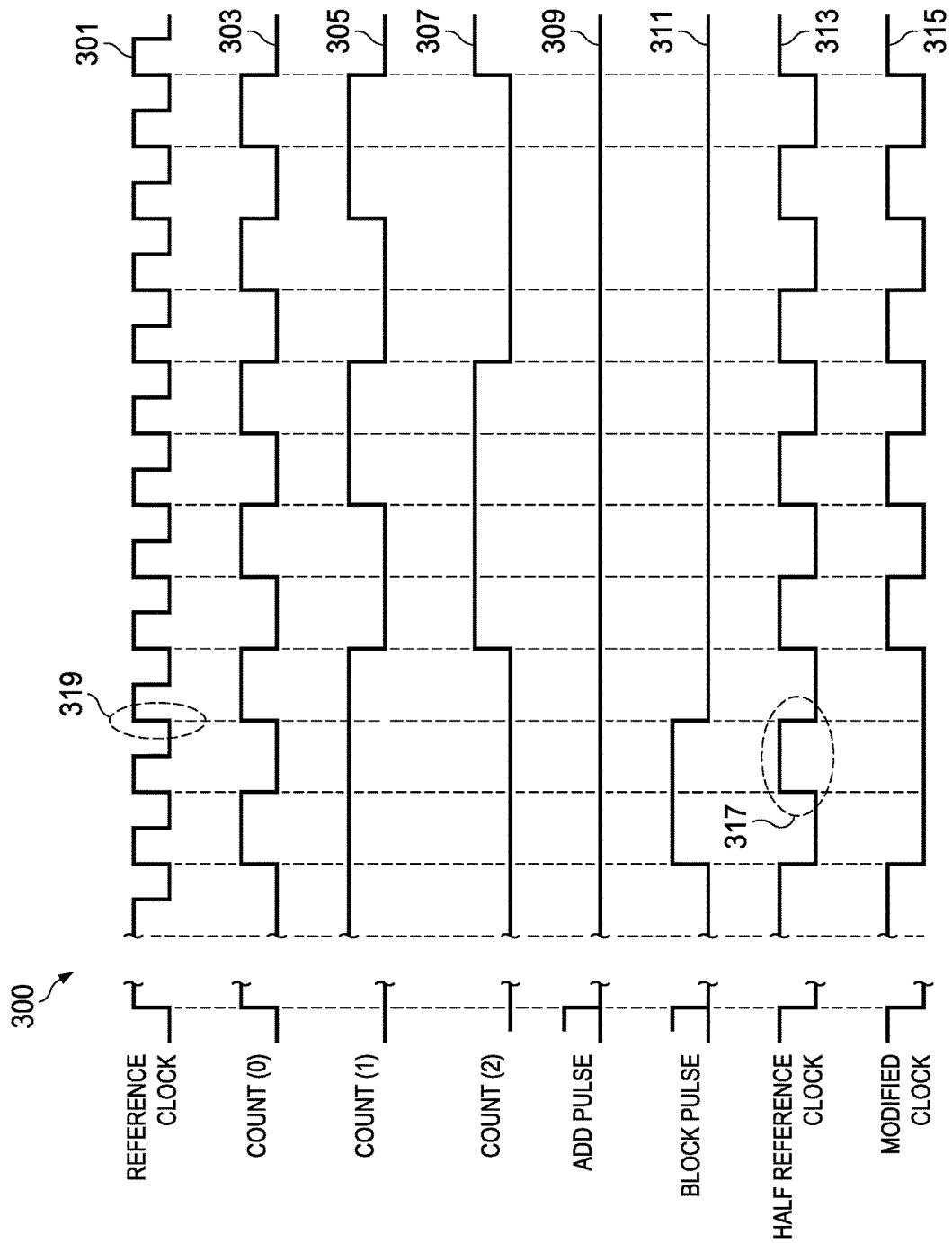
FIG. 3 is a timing diagram that illustrates the states of selected signals illustrated in FIG. 1 for a clock pulse being blocked.

FIG. 3 is a timing diagram 300 that illustrates the states of selected signals illustrated in circuit 100 of FIG. 1. FIG. 3 illustrates a case where a pulse of the half reference clock signal pulse stream is blocked. The block pulse and add pulse signals (traces 311 and 309 respectively in FIG. 3) are generated external to circuit 100 (see FIG. 1). The block pulse signal pulses to a logic high during the half reference clock cycle (trace 313 of FIG. 3) where the clock manipulation occurs (the add pulse signal is a logic low). The result is that clock modification circuit (block 109 of FIG. 1) removes a pulse (event 317 in FIG. 3) from the half reference clock pulse stream when generating the modified clock signal (trace 315 of FIG. 3). The modified clock signal provides the timing to the 14 most significant bits of the prescaler (shown in FIG. 1).

In FIG. 3, the signals count (0), count (1), and count (3) of FIG. 1 (traces 303, 305, and 307, respectively) depart from a normally monotonically increasing count pattern for two cycles of the reference clock signal (trace 301 in FIG. 3). This is due to the clock manipulation illustrated in trace 315 of FIG. 3. Removal of the clock pulse described hereinabove results in all bits (excluding the least significant bit) of the prescaler to stop incrementing for two cycles of the reference clock signal. The normal counting pattern is restored at the clock edge (event 319 in FIG. 3) with the count value having being reduced by 2 (compared to what the count value would have been at event 319 without the clock manipulation illustrated in trace 315 of FIG. 3).

The maximum frequency offset that can be corrected by the conventional approach of adding and blocking clock pulses within the prescaler depends on: the maximum number of clock pulses that can be added or blocked by the RTC within a specific period of time; the span of time over which the RTC completes one cycle of corrections (the correction cycle); and the nominal frequency of the clock pulse stream being modified. Correction cycles are typically repeated continuously with approximately no delay between successive correction cycles. For example, an RTC frequency offset correction function implemented to either add or block clock pulses up to 4 pulses per second during a 1 minute correction cycle can add or block up to 240 clock pulses per minute (4 pulses per second multiplied by 60 seconds per minute). In a case where the reference clock frequency is nominally 32 kHz, and pulses are being added to (or blocked from) a nominally 16 kHz clock pulse stream that is generated by dividing the reference clock as described hereinabove, the maximum fraction of frequency correction is approximately ±240 pulses per minute divided by the quantity 16,384 pulses per second and multiplied by 60 seconds per minute. Thus, the maximum frequency correction is approximately ±0.0244%, or ±244 parts per million (ppm).

The minimum non-zero frequency offset that can be corrected by the conventional approach of adding and blocking clock pulses within the prescaler depends on the minimum number (other than zero) of clock pulses that can be added or blocked within each correction cycle, and the nominal frequency of the clock pulse stream being modified. Based on the example described above, the minimum number (other than zero) of pulses per minute that can be added or blocked within the nominally 16 kHz clock pulse stream is one. The minimum non-zero fraction of frequency correction is approximately ±1 pulse per minute divided by the quantity 16,384 pulses per second, multiplied by 60 seconds per minute which is approximately ±0.0001% or ±1 ppm.

Additionally, the discrete increments of frequency correction that can be performed by the conventional RTC described hereinabove are also separated by approximately 1 ppm. For example, a correction cycle of 70 added or blocked pulses per minute results in an approximate correction of 71.2 ppm. A correction cycle of 71 added or blocked pulses per minute results in an approximate correction of 72.2 ppm.

The conventional RTC described hereinabove employs an asynchronous counter and clock manipulation to modify the counting sequence during counter operation. Asynchronous circuit topologies and some approaches to clock manipulation together or individually often result in circuits that are not compatible with currently used common tools for circuit synthesis, scan test insertion, and automatic test program generation (ATPG). As a result, the development of a manufacturing test and verification program for such circuits typically involves customized test approaches and significant manual effort, often resulting in portions of the circuit being untestable within a reasonable amount of time during circuit manufacturing. Alternatively, the tests for the real time clock circuits can take weeks to complete, increasing costs and reducing throughput of the manufacture and test process.

Figure 4:
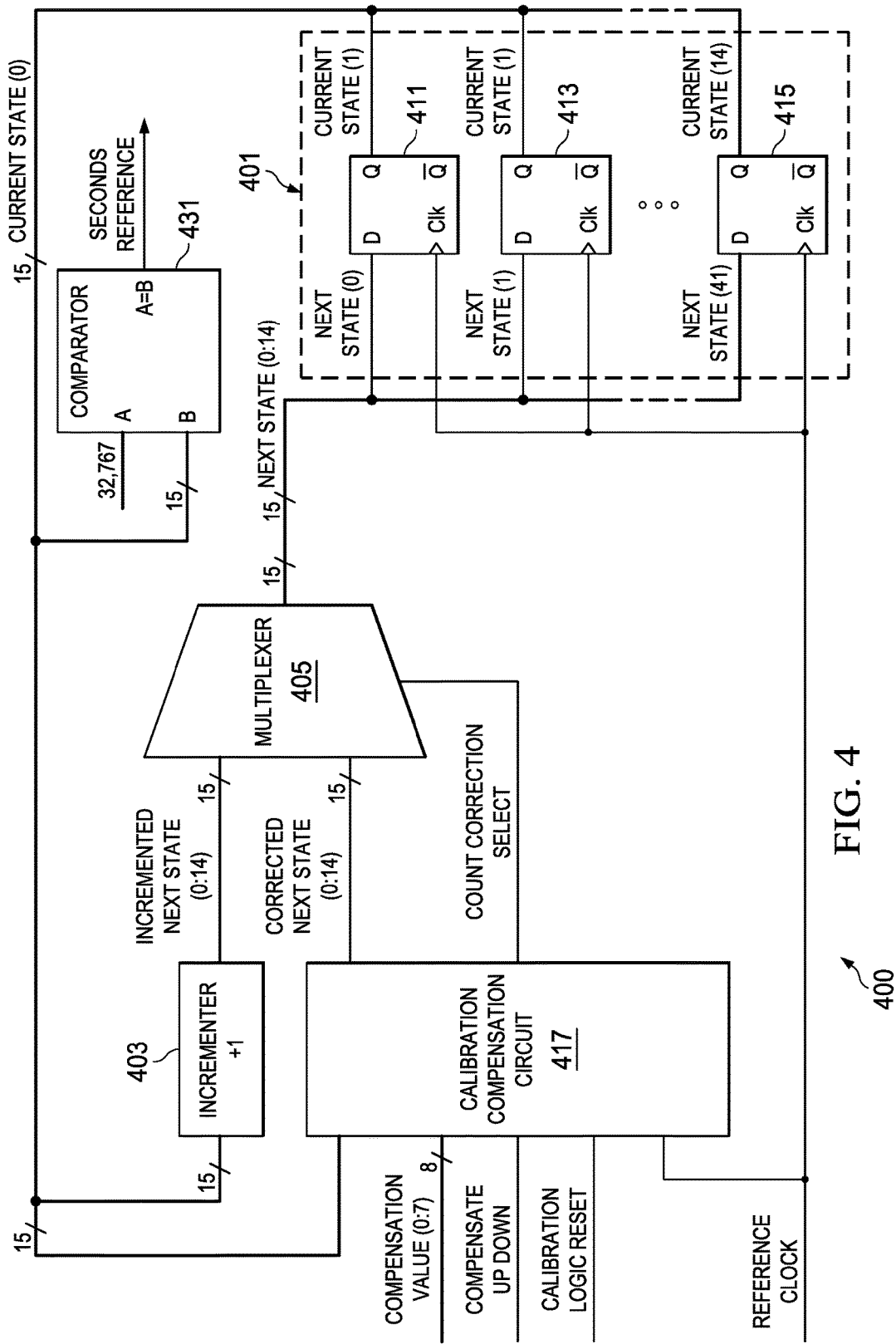
FIG. 4 is a block diagram illustrating an example embodiment of the prescaler and the compensation circuitry of an RTC.

FIG. 4 is a block diagram an example embodiment of a real-time clock prescaler 400 including circuitry to compensate for frequency offset. Compensation is accomplished by loading a modified state into a prescaler in a single reference clock cycle. The loading of the prescaler is performed repetitively over multiple clock cycles, depending on the magnitude of the frequency offset. In the example illustrated in FIG. 4, the reference clock is nominally 32 kHz; however, other clocking frequencies can be used for the reference clock. The embodiment real-time clock prescaler is fully synchronous. The approach used to compensate the counter value is to load a counter register with various values on receiving a reference clock. Additionally, the embodiment real-time clock circuit does not employ clock manipulation such as adding and blocking clock pulses. By utilizing a fully synchronous design approach without clock manipulation, the embodiment is fully compatible with the scan test insertion, ATPG tools, and circuit synthesis design techniques currently in use to design integrated circuits. The real-time clock prescaler can therefore be utilized in a design library or reusable IP library that can be ported to various semiconductor manufacturing process nodes, using automatic test pattern generation (ATPG) to verify the proper operation of the manufactured circuitry, without the need for customized or manual test pattern generation and testing. Use of the embodiments therefore lowers costs of manufacture and reduces testing time, and further, increases reliable operation by assuring use of robust and comprehensive test patterns. In contrast, manual testing used in the prior approaches cannot necessarily achieve the same level of robust testing.

The example embodiment illustrated in FIG. 4 is based on a 15 bit prescaler. The prescaler state is stored a 15 bit register, which is implemented as 15 D-type flip-flops. Block 403 performs an increment by 1 function on the 15 bit value on the bus labeled "current state (0:14)" in FIG. 4. The incremented value is output on the bus labeled "incremented next state (0:14)" in FIG. 4. Prescaler register 401 is coupled with block 403 to form a typical synchronous counter when clocked by the signal labeled "reference clock." When the multiplexer 405 is configured to couple block 403 to the 15 bit data input of the prescaler register 401 utilizing the bus labeled "next state (0:14)" in FIG. 4, the counter increments.

In additional examples, the count can be stored in devices other than the prescaler register 401. It is not necessary that the count proceed in a monotonic fashion. Devices that form repeating predictable patterns such as linear feedback shift registers (LFSRs), shift registers, and other repeating pattern generators can be used as alternatives to a monotonically increasing counter.

In the example of FIG. 4, the frequency of the reference clock signal is nominally 32 kHz and is generated as described below in the description of FIG. 7. The clock signal is a stream of logic pulses at the 32 kHz clock frequency. In alternative embodiments, other frequency clocks (including frequencies that are not an integer power of 2) can be used, so long as the circuit illustrated in FIG. 4 correspondingly adjusted.

For the case of a 32 kHz reference clock, the incrementing circuit 403 produces an output a value of zero when the input on the "current state (0:14")" bus is 32,767 (the maximum for an un-signed 15 bit number). Circuit 400 generates an approximate 1 Hz reference on the output signal labeled "seconds reference" in FIG. 4. In the example circuit 400 of FIG. 4, the approximate 1 Hz reference is a pulse on the seconds reference signal generated by the comparator 431. Comparator 431 compares the value of the current state on the 15 bit current state (0:14) bus to the value 32,767, which is the maximum value that the prescaler counter will reach. With a 32 kHz reference clock, this value will occur approximately once per second. Note that other input values for the comparator 431 can be used so long as the count value is equivalent to the target pattern repeating approximately once per second. For example, all zeros can be used.

For simplicity of illustration, three of the 15 flip-flops of prescaler register 401 are shown in FIG. 4. These are flip-flops 411 and 413 that store the least 2 significant bits of the state register and flip-flop 415 that stores the most significant bit. The remaining 12 flip-flops and the corresponding interconnects are not explicitly illustrated, but are present as indicated by the series dots shown between 413 and 415. In the example of FIG. 4, prescaler register 401 utilizes D-type flip-flops. In alternative embodiments, other types of storage elements may be employed and may require different interconnect and control functionality from that described herein. Example embodiments can also include a reset signal for the prescaler register 401. This reset signal is not illustrated in FIG. 4 for simplicity of explanation.

Calibration compensation circuit 417 of FIG. 4 controls the adjustment of the prescaler value to compensate for oscillator frequency offset. The example illustrated in FIG. 4 is based on the calibration compensation circuit 417 completing one full cycle of frequency offset correction per minute. Within a one minute cycle, the calibration compensation circuit 417 performs up to 4 correction events per second for a maximum of 60 seconds, resulting in a minimum of zero and a maximum of 240 correction events per minute. The number of correction events can vary from a minimum of 0 to a maximum of 4 in each second of the 60 second correction cycle. In alternative embodiments, the length of the correction cycle and the minimum and maximum number of correction events per correction cycle can each differ from the above example, or can be variable. In addition, in alternative embodiments the correction cycle may not be divided into increments, or it can be divided into increments other than seconds.

The oscillator frequency offset can be determined during system manufacture, setup, or maintenance. The oscillator frequency offset can also be determined at other times by automated or manual means. In order to partly correct for the oscillator frequency offset and reduce accumulated time and calendar error within the RTC, the frequency offset can be converted to the number of correction events to perform within one correction cycle, and the type of correction event. The type of correction event is referenced herein as either an "up" compensation or a "down" compensation. Both types of correction events are described below with examples for a prescaler embodiment implemented with a synchronous counter as illustrated in FIG. 4. "Down" compensations are employed for actual (measured) oscillator frequencies greater than the nominal frequency, and "up" compensations are employed for actual oscillator frequencies that are less than the nominal frequency.

The two data values (the number of correction events to perform per correction cycle and the type of correction event) can be stored in system non-volatile memory or in memory within the RTC. In the example of FIG. 4 these data values are placed on the 8 bit bus labeled "compensation value (0:7)" and the signal labeled "compensate up down" respectively as described hereinbelow in the description of FIG. 7.

Systems using an RTC can employ a temperature sensor and can contain oscillator characterization data of temperature vs. frequency offset. The system can be implemented to modify the number of correction events to perform per correction cycle and the type of correction event as the oscillator temperature changes over time, resulting in these modified values being placed on the compensation value (0:7) bus and the compensate up down signal prior to the beginning of a correction cycle.

The number of correction events to be performed in the current one minute correction cycle is input to the circuit 400 on the compensation value (0:7) bus. In alternative embodiments, the compensation value (0:7) bus can be more or less than 8 bits to accommodate a maximum number of corrections events per correction cycle differing from the example embodiment. The beginning of the one minute correction cycle starts when the signal labeled "calibration logic reset" in FIG. 4 is asserted. The type of corrections to be performed during the one minute cycle is indicated by the compensate up down signal. In this example embodiment, when the compensate up down signal is a logic high, each correction event within the current correction cycle will result in incrementing the current prescaler state by 2 during one cycle of the reference clock signal (an "up" compensation). For these correction events the current prescaler state on the current state (0:14) bus is incremented by 2, and the resulting value placed on the 15 bit bus labeled "corrected next state (0:14)" in FIG. 4. When the compensate up down signal is a logic low, each correction event occurring within the current correction cycle will result the prescaler not being incremented during one cycle of the reference clock signal (a "down" compensation). For these correction events the current prescaler state on the current state (0:14) bus is transferred to corrected next state (0:14) bus without modification. The compensation value (0:7) bus and the compensate up down signal are generated by circuitry external to circuit 400 of FIG. 4 as described below.

The calibration compensation circuit 417 controls the multiplexer 405 with the signal labeled "count correction select" illustrated in FIG. 4. For reference clock cycles where no correction event occurs, the count correction select signal is set to a logic low. When the count correction select signal is low, the multiplexer 405 selects the incremented next state (0:14) bus. For clock cycles where a correction event occurs, the count correction select signal is set to a logic high. When the count correction signal is a logic high, multiplexer 405 selects the corrected next state bus (0:14) generated by the calibration compensation circuit 417 as described hereinabove. The output of the multiplexer 405 is coupled to the data input of prescaler register 401 and is the state that will be clocked into prescaler register 401 by the next active edge of the reference clock signal. The calibration compensation circuit 417 can be implemented with a state machine or other type of circuit to perform the prescaler value correction operations described hereinabove. The calibration compensation circuit 417 can be implemented using a microcontroller or other programmable device.

Figure 5:
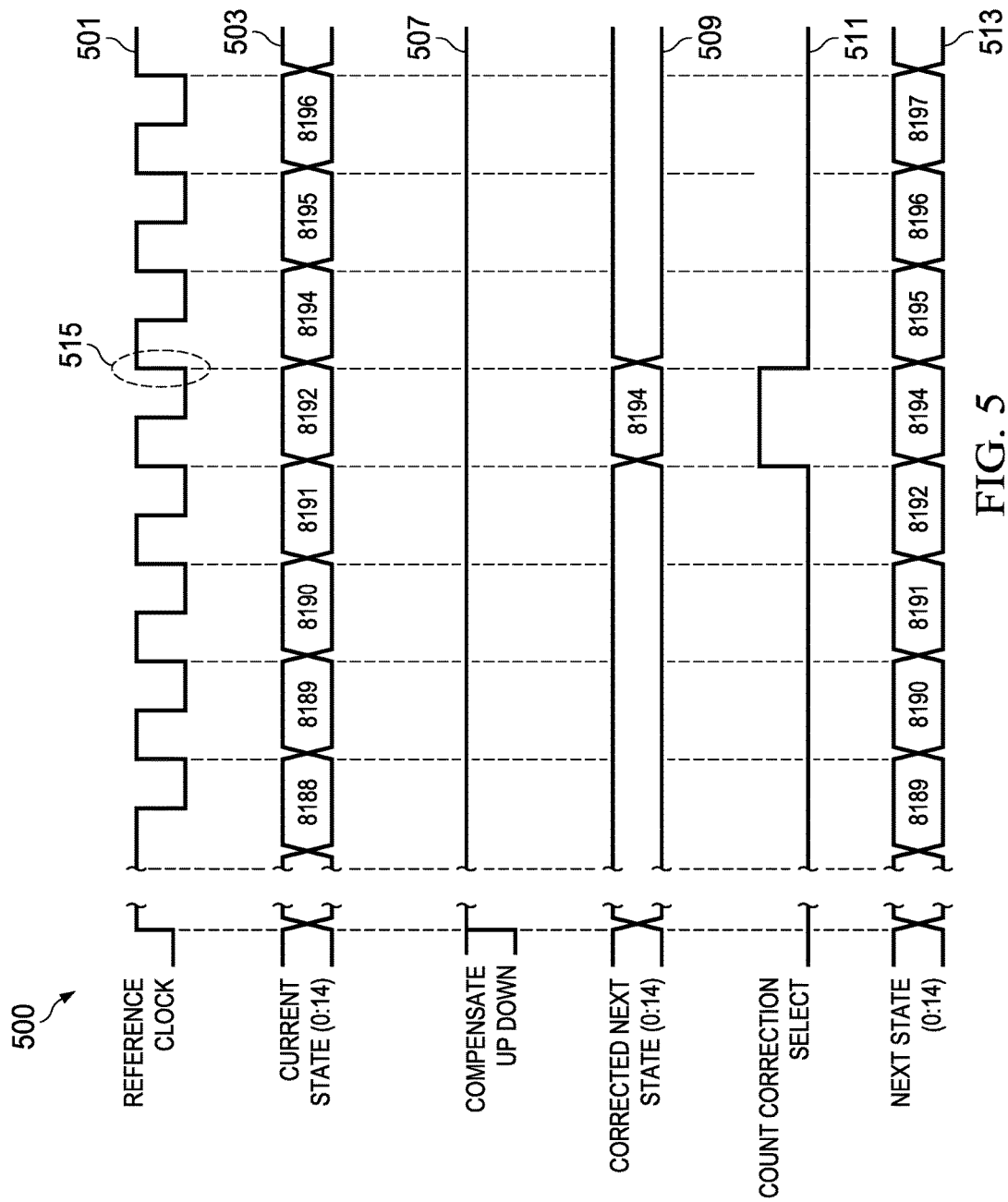
FIG. 5 illustrates in a timing diagram the states of selected signals illustrated in FIG. 4 for an "up" compensation.

FIG. 5 illustrates in a timing diagram 500 the states of selected signals illustrated in FIG. 4. In FIG. 5, an example where a prescaler count correction event occurs for an "up" compensation is shown. In the example illustrated in FIG. 5, the prescaler state transitions from the value 8192 to 8194 during the transition between two consecutive reference clock cycles. (In contrast, for the case where a correction event does not occur, the prescaler counter would transition from 8192 to 8193). The compensate up down signal (trace 507 of FIG. 5) is in a logic high state indicating that the correction is an "up" compensation. The count correction select signal (trace 511 of FIG. 5) transitions from low to high prior to a specific cycle of the reference clock (trace 501 of FIG. 5). In the example of FIG. 5, the correction event occurs at the rising edge (event 515 of FIG. 5) of the reference clock immediately following the reference clock cycle in which the count correction select signal transitions to a logic high. In the reference clock cycle immediately preceding event 515 the calibration compensation circuit (block 417 of FIG. 4) has placed the value of the current state (0:14) bus (trace 503 of FIG. 5) incremented by 2 (a value of 8194) on the corrected next state bus (0:14) as illustrated in trace 509 in FIG. 5. Also, prior to event 515 the count correction select signal switches the multiplexer 405 of FIG. 4, resulting in the state of the corrected next state bus (0:14), a value of 8194, being placed on the next state (0:14) bus (trace 513 of FIG. 6). At event 515 the value 8194 on the next state (0:14) bus is clocked into the prescaler register (401 of FIG. 4). Trace 503 illustrates that the current state (0:15) bus (and thus the prescaler register current state) has transitioned from a value of 8192 to 8194 during the transition (event 515 in FIG. 5) between two consecutive reference clock cycles completing an "up" compensation for an actual reference clock frequency that is less than the nominal frequency. In the example of FIG. 5 at the next active reference clock edge immediately following event 515 the prescaler is incremented to 8195 in as illustrated in trace 503.

Figure 6:
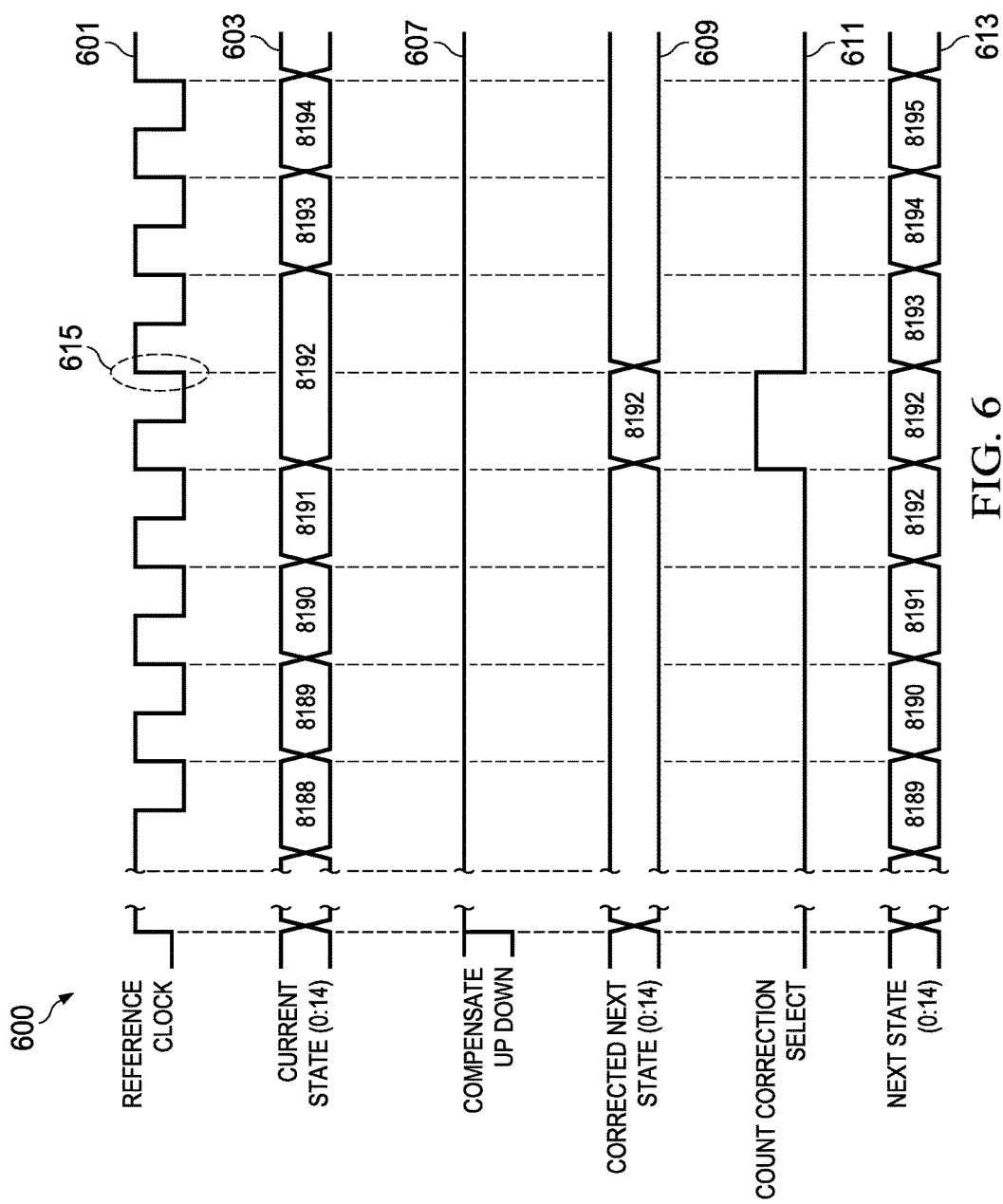
FIG. 6 illustrates in a timing diagram the states of selected signals illustrated in FIG. 4 for a "down" compensation.

FIG. 6 illustrates in a timing diagram 600 the states of selected signals illustrated in FIG. 4 for an example where a prescaler count correction event occurs for a "down" compensation. In the example illustrated in FIG. 6, the prescaler state is the value 8192 for two consecutive reference clock cycles. (In contrast, for the case where a correction event does not occur, the prescaler counter would be incremented from the value 8192 to 8193 during the transition to the second of these two consecutive clock cycles). The compensate up down signal (trace 607 of FIG. 6) is in a logic low state indicating that the correction type is a "down" compensation. The count correction select signal (trace 611 of FIG. 6) transitions from low to high prior to a specific cycle of the reference clock (trace 601 of FIG. 6). In the example of FIG. 6 the correction event occurs at the rising edge (event 615 of FIG. 6) of the reference clock immediately following the reference clock cycle in which the count correction select signal transitions to a logic high. In the reference clock cycle immediately preceding event 615 the calibration compensation circuit (block 417 of FIG. 4) has placed the unmodified value (8192) of the current state (0:14) bus (trace 603 of FIG. 6) on the corrected next state bus (0:14) as illustrated in trace 609 in FIG. 6. Also prior to event 615 the count correction select signal switches the multiplexer 405 of FIG. 4 resulting in the state of the corrected next state bus (0:14), a value of 8192, being placed on the next state (0:14) bus (trace 613 of FIG. 6). At event 615 the value 8192 on the next state (0:14) bus is clocked into the prescaler register (401 of FIG. 4). Trace 603 illustrates that the current state (0:15) bus (and thus the prescaler register current state) has the value of 8192 for two consecutive reference clock cycles completing a "down" compensation for an actual reference clock frequency that is greater than the nominal frequency. In the example of FIG. 6, after the prescaler completes two consecutive reference clock cycles with a state of 8192 it is then incremented to 8193 in the next reference clock cycle as illustrated in trace 603.

As described hereinabove, the example embodiment illustrated in FIG. 4 performs up to 4 correction events per second during a correction cycle of 60 seconds resulting in a maximum number of 240 corrections per minute. Correction cycles are repeated continuously with approximately no delay between successive correction cycles. The correction event of a single prescaler count value occurs within one cycle of the 32 kHz reference clock. Therefore, the maximum fraction of frequency correction for the example embodiment is approximately ±240 counts per minute, divided by the quantity 32,768 counts per second, multiplied by 60 seconds per minute, which is approximately ±0.0122% or ±122 ppm. The minimum non-zero fraction of frequency correction is approximately ±1 count per minute, divided by the quantity 32,768 counts per second, multiplied by 60 seconds per minute, which is approximately ±0.000051% or ±0.51 ppm. Additionally, the discrete increments of frequency correction that can be performed by the example embodiment described hereinabove are also separated by approximately 0.51 ppm. For example, a correction cycle of 70 corrections per minute results in an approximate correction of 35.60 ppm and a correction cycle of 71 corrections per minute results in an approximate correction of 36.11 ppm.

The calculation of the number of correction events to perform per minute and the determination of the correction type (compensate "up" or "down") are made utilizing an approach similar to that described for the conventional RTC. For the example embodiment, the number of corrections to perform per minute is the absolute value of the frequency offset in Hz, multiplied by 60 seconds per minute, the length of the correction cycle. The determination of correction type is made based on whether the actual (measured) oscillator frequency is greater or less than the nominal oscillator frequency. For cases of the actual frequency being lower than the nominal frequency, the correction type is compensate "up." For cases of the actual frequency being higher than the nominal frequency, the correction type is compensate "down." It should be noted that either the oscillator or the reference clock frequency can be utilized to determine frequency offset. For systems that employ temperature compensation for frequency offset correction, the number of correction events per correction cycle and correction type can be modified by the system as the oscillator temperature changes.

Alternative embodiments of the prescaler and circuitry to compensate for frequency offset can be implemented to achieve a maximum fraction of frequency correction that is greater than the above example and a minimum non-zero fraction of frequency correction less than the above example. A greater maximum fraction of frequency correction can be achieved by increasing the maximum number of correction events within a correction cycle (one minute in the above example) such as performing up to eight correction events per second, compared to four per second in the above example. A lower minimum non-zero fraction of frequency correction can be achieved by increasing the time period of the correction cycle (in which the non-zero minimum of one correction event can occur).

Alternative embodiments can be implemented with different approaches for frequency offset compensation. The example described hereinabove is based on correction events occurring up to four times per second during a 60 second correction cycle. Each correction event either retains the prescaler state or skips a single prescaler state in a single reference clock cycle. Different approaches to frequency offset compensation can include, without limitation, the following: correction cycles of more or less than 60 seconds or with a variable length of time; correction events occurring more or less frequently than four times per second or a variable number of events within a time period (such as one second); each correction event spanning more than one reference clock cycle or a variable number of clock cycles; correction events skipping multiple prescaler states within a one or more reference clock cycles; and correction events retaining the prescaler state for multiple reference clock cycles.

Employing prescalers with circuitry to compensate for frequency offset similar to the example embodiment described herein permits utilization of circuit synthesis, scan test insertion, and automated test program generation (ATPG) tools to produce circuit manufacturing test programs with potentially minimal development costs, potentially minimal test time per circuit manufactured, and with potentially higher fault coverage. In addition, the minimum frequency correction as well as the discrete increments of frequency correction that can be achieved by the example embodiment for a specific correction cycle period, such as one minute, and a specific oscillator frequency, such as 32 kHz, can be improved by approximately a factor of two over the prior approaches when a fully synchronous circuit without clock manipulation is employed.

Figure 7:
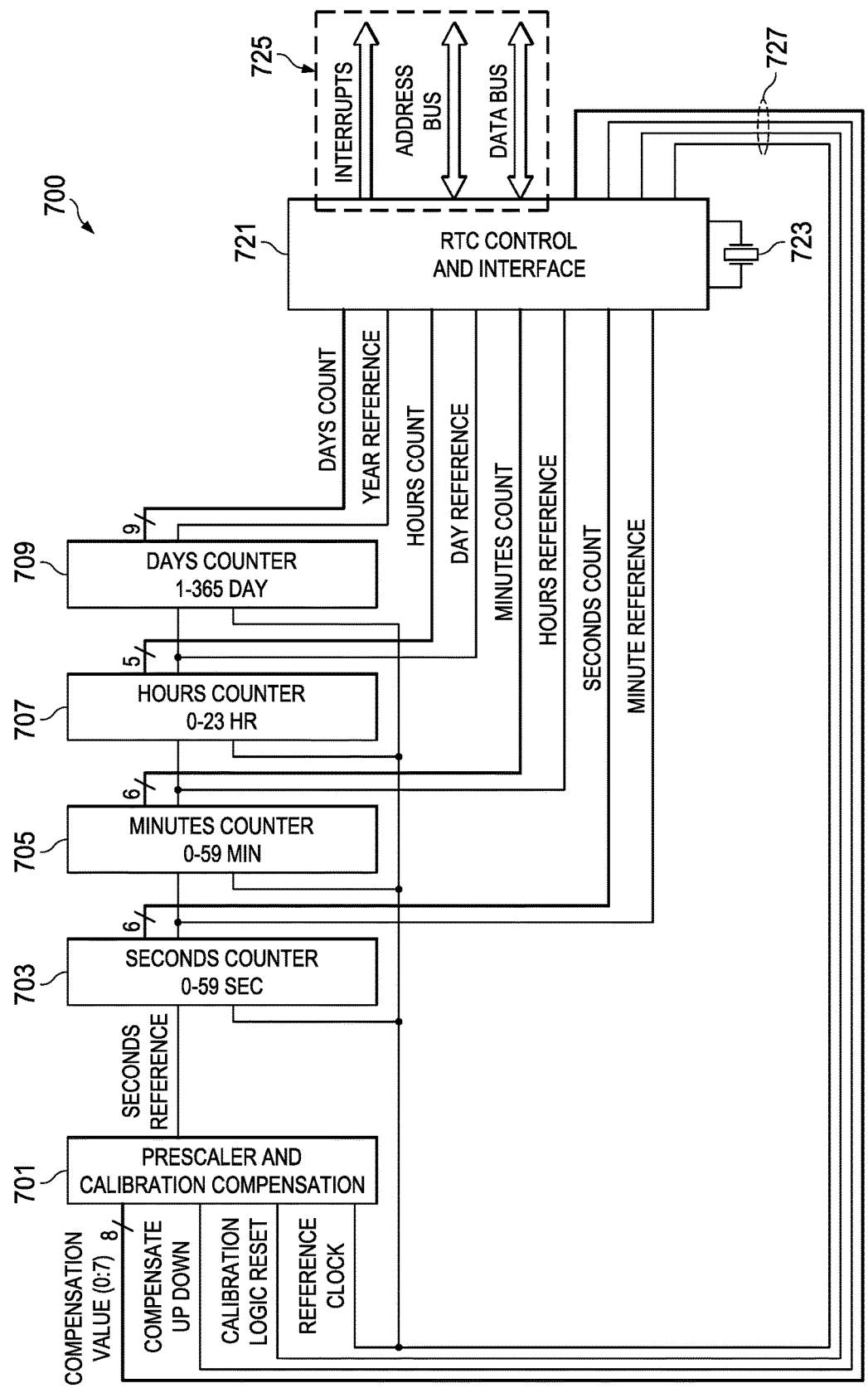
FIG. 7 is a block diagram illustrating an example RTC circuit including the example prescaler and compensation circuitry illustrated in FIG. 4.

FIG. 7 is a block diagram for an example RTC circuit 700. The RTC circuit 700 employs the example prescaler and circuitry to compensate for frequency offset described hereinabove in block 701 in FIG. 7. Block 701 represents a circuit corresponding to real time clock prescaler circuit 400 of FIG. 4. The example RTC 700 employs individual counter blocks 703, 705, 707 and 709 to count seconds, minutes, hours, and days respectively. These four blocks and block 701 are clocked by the signal labeled "reference clock" in FIG. 7. Generation of the reference clock is described below. The signals labeled "seconds reference", "minute reference," "hour reference," and "day reference," pulse to the asserted logic state once per second, per minute, per hour, and per day, respectively, to enable the seconds, minutes, hours, and days counters to increment by one on the next active edge of the reference clock. The seconds counter 703 rolls from the value fifty-nine to zero once per minute. The minutes counter 705 rolls from the value fifty-nine to zero once per hour. The hours counter rolls from the value twenty-three to zero once per day. The days counter rolls from the value three hundred sixty five to one once per non-leap year. It should be noted that the RTC 700 does not illustrate a circuit that performs the function that results in the days counter rolling from the value three hundred sixty six to one (for a leap year) for simplicity of explanation. However, RTCs that employ the capability to maintain a calendar often employ a circuit to increment the days counter through three hundred sixty six days in a leap year.

Block 721 of FIG. 7 is the RTC control and interface circuit. RTCs are often employed as a peripheral of a host processor. Block 721 is drawn with a group of signals (725) labeled "interrupts," "address bus," and "data bus" employed for host processor interfacing. Alternative embodiments of the RTC can be made to interface different types of processors and non-processor circuits such as state machines with signals other than those illustrated in FIG. 7. In FIG. 7 the RTC circuit 700 is coupled as an addressable component on an address bus with a bidirectional data bus to allow the host processor to read and write to and from register locations within the circuit 700.

Block 721 of FIG. 7 outputs the group of signals 727 labeled "compensation value (0:7)," "compensate up down," and "calibration logic reset." The group of signals 727 are inputs to the calibration compensation circuit block 701 that includes calibration compensation circuitry such as block 417 of FIG. 4 and functions as described previously in the description of FIGS. 4, 5, and 6.

Block 721 of FIG. 7 is also coupled to the counters 703, 705, 707, and 709 such that the current state of each counter can be read by a host processor or other type of external circuit. In addition, being coupled to the current states of these counters allows block 721 to be implemented with functionality including interrupt generation based on time and calendar values and determining when annual time adjustments (such as daylight savings time and standard time) are to be performed.

For some example embodiments, block 721 of FIG. 7 employs circuitry such that the host processor or other type of external circuit can transfer data to the RTC and configure RTC functionality. Examples include transferring data for the compensation value (0:7) bus and compensate up down signal and initial time and calendar values and configuring RTC functionality such as interrupt generation rules based on time and calendar state (interrupt generation daily at midnight and noon are examples) and rules for switching between Winter and Summer time systems.

For simplicity of illustration, FIG. 7 does not illustrate circuitry to load values into the counters 703, 705, 707, and 709. Loading values into these counters can be done when the system is initially setup and to correct the RTC time and calendar values due to error accumulation, battery power loss, or other reasons.

FIG. 7 illustrates external crystal 723 coupled to block 721. For this example, block 721 employs an oscillator circuit that resonates with the crystal 723 and a circuit coupled to the oscillator that generates the reference clock signal unitizing logic levels that can be employed by the digital circuit elements of the RTC 700.

Figure 8:
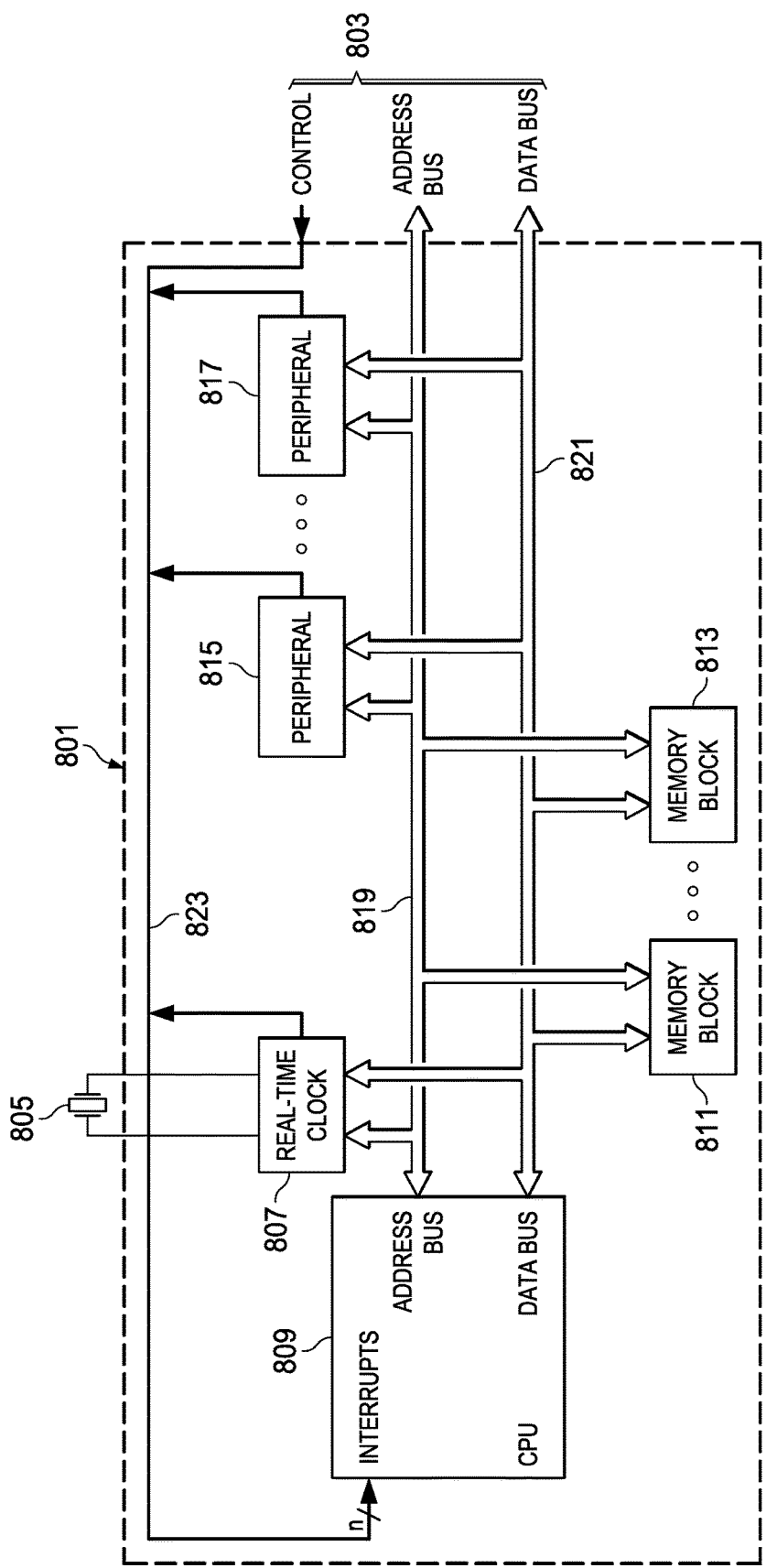
FIG. 8 is a block diagram for a microcontroller integrated circuit incorporating the RTC embodiment illustrated in FIG. 7.

FIG. 8 is a block diagram for a microcontroller integrated circuit (IC) 801. Crystal 805 and the group signals 803 (address, data, and control) are illustrated external to IC 801. The IC 801 includes the example RTC (block 807) described hereinabove coupled to the crystal 805 and the microcontroller CPU 809. The RTC block 807 represents a circuit corresponding to the block diagram 700 of FIG. 7 described previously. Microcontroller ICs typically include one or more memory blocks and multiple peripherals. The internal memory blocks are illustrated as blocks 811 and 813, and the internal peripherals are illustrated as blocks 815 and 817. Additional memory and peripheral blocks that can be present in example embodiments of IC 801 are indicated by the dots shown between 811 and 813 and between 815 and 817. Example embodiments of IC 801 can be made with fewer than 2 memory blocks and fewer than 2 peripherals. The address and data busses 819 and 821 respectively and the interrupt signals 823 are illustrated coupled to the CPU, RTC, memory, and peripherals as well as available external to the IC (except that the interrupt signals are not coupled to the memory blocks). As described hereinabove the address and data busses transfer time, calendar, frequency offset correction, configuration, and other data between the RTC and the CPU. The interrupt signals are employed by the RTC to notify the CPU that predefined and configurable events have occurred. For simplicity of illustration and explanation block diagram 801 does not illustrate a number of blocks and signals that are employed in typical microcontroller ICs.

FIGS. 7 and 8 do not illustrate an external battery that can be used to power RTCs, for simplicity of illustration.

Example embodiment RTCs can be implemented to operate at different voltage levels including in circuit arrangements with more than one RTC (typically 2 RTCs). In a case where two RTCs are employed within a system, one embodiment RTC can be optimized to operate at low voltage with low power consumption typically powered by a battery when the system is powered off or is in a stand-by state. A second embodiment RTC within the system can operate at the same higher voltage level as other parts of the IC or system. In such a case, time and calendar values and RTC settings would typically be transferred between the 2 RTCs when the system transitions between operating and stand-by or powered off states.

The example embodiment circuits shown can be implemented in a variety of ways. For example, the real-time clock prescaler in FIG. 4 can be implemented as a standalone circuit; as logic gates on an integrated circuit with additional functions; as part of a reusable design library used in designing integrated circuits such as application specific integrated circuits (ASICs); as part of a user programmable device such as an field programmable gate array (FPGA) or complex logic programmable device (CPLD); as a mixture of executable instructions and logic gates; or as a circuit on a circuit board implemented using discrete devices such as registers, logic gates, and multiplexers. Similarly, the real-time clock circuit embodiment of FIG. 7 can be implemented as a standalone integrated circuit, as a reusable design element in a design library, as a portion of another integrated circuit, on an FPGA or CPLD, or as a mixture of executable instructions for a processor and logic gates, or can be implemented with a processor core on an integrated circuit. The embodiments may be used in a circuit design library that is fully parameterized for manufacture by one or more known semiconductor fabrication facilities.

Figure 9:
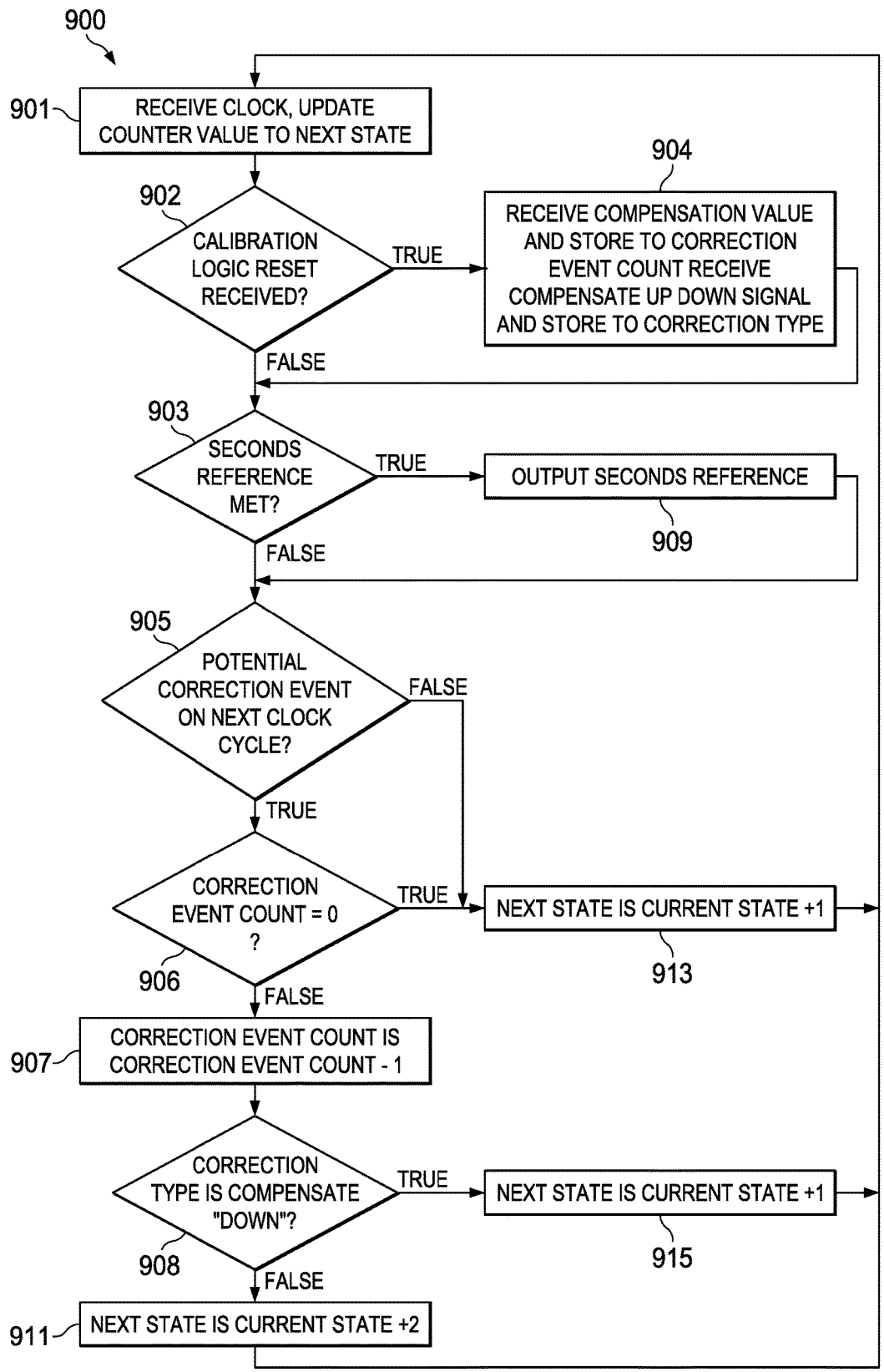
FIG. 9 illustrates in a flow diagram a method embodiment.

FIG. 9 is a flow diagram for a method embodiment 900. The method begins at step 901, in which a counter value is updated to the next state, responsive to a receiving a reference clock. At step 902 a comparison is performed. If the calibration logic reset has been received indicating the beginning of a correction cycle the comparison is true the method transitions to step 904. At step 904 the data on the compensation value (0:7) bus is transferred to a storage location designated "correction event count," and data on the compensate up down signal is transferred to a storage location designated "correction type," and the method transitions to step 903. The calibration logic reset is generated once per minute in the real-time clock circuit example embodiment described hereinabove. This happens external to the method 900. In alternative arrangements the correction cycle as well as the time between consecutive occurrences of the calibration logic reset can be more or less than one minute. Returning to step 902 if the comparison is false the method also transitions to step 903.

At step 903, a comparison is performed. If the condition for the seconds reference is met, the comparison is true and the method transitions to step 909. In the real-time clock circuit embodiments described hereinabove, this condition is true when the count value is equal to a constant, such as 32,727. In alternative arrangements, other count values can be used. So long as the count value occurs in a count cycle at one time per second, the count value can be used. At step 909, the seconds reference signal is output, and the method then transitions to step 905. Returning to step 903, if the comparison is false, the method also transitions to step 905.

At step 905, a comparison is made. If the counter value updated in step 901 is equivalent to a predefined value indicating that the next clock cycle is a potential correction event the comparison is true and the method transitions to step 906. In the real-time clock circuit example embodiments described hereinabove there are four potential correction events per second. Therefore, for example, the predefined counter values indicating that the next clock cycle is a potential correction event could be 0, 8192, 16,384, and 24,576. In alternative arrangements other approaches can be employed to indicate a potential correction event such as an additional counter separate from the prescaler counter that generates a pulse four times per second for an embodiment where 4 potential correction events occur per second. At step 906, a comparison is made. If the correction event count is not zero indicating that the current potential correction event will result in prescaler correction, the comparison is false and the method transitions to step 907.

Returning to step 905, if the comparison is false the method transitions to step 913. Returning to step 906, if the comparison is true the method also transitions to step 913. At step 913, the next state is set to the current state incremented by 1. By performing an increment by 1 no adjustment is made and the resulting value is the next consecutive value in the monotonically increasing sequence. From step 913, the method transitions to step 901.

At step 907 the value contained in the correction event count storage location (see step 904) is decremented by 1 and returned to the storage location and the method transitions to step 908.

At step 908 a comparison is made. If the value placed into the correction type storage location (see steps 904) indicates a compensate "down" correction type, the comparison is true and method transitions to step 915. At step 915, the next state is the same as the current state, that is, the value is not incremented. By performing this adjustment the counter is adjusted negatively over one or more clock cycles. From step 915 the method transitions to step 901.

Returning to step 908, if the comparison is false, indicating a compensate "up" correction event, the method transitions to step 911. At step 911, the next state is adjusted to the current state incremented by 2. In this manner, the count is adjusted positively by one clock cycle over one or more clock cycle. From step 911 the method transitions to step 901.

From step 915, step 913, and step 911, the method returns to step 901 and continues. In this manner a synchronous method for operating a real-time clock is performed.

Because no asynchronous clock insertions are used and because the method can be implemented as a fully synchronous circuit, both of which are compatible with automatic test pattern generation and circuit synthesis. The circuitry can be automatically synthesized by design tools and more fully tested, which is not possible when using asynchronous counting and clock insertion techniques as in the prior known approach real-time clock circuits and methods.

Note that the order of steps illustrated in the example embodiment of FIG. 9 illustrate one approach to performing the method. Alternative embodiments can be formed using a different order of steps. The seconds reference comparison of step 903 can be performed in parallel with the other steps and independently of the other steps; while the comparisons in 905, 906 can be performed simultaneously or in a different order than that shown in the example of FIG. 9.

In described examples, an apparatus includes: a counter configured to receive a reference clock and having a next state input and a current state output; a multiplexer coupled to the next state input of the counter, configured to output one of an incremented next state value and a corrected next state count value responsive to a count correction select control signal. The apparatus further includes a seconds reference circuit coupled to the current state output of the counter, configured to output a seconds reference signal. The apparatus further includes: an incrementer coupled to the current state output of the counter, configured to output the incremented next state value; and a calibration compensation circuit coupled to a compensate up down input signal and to the current state output of the counter, configured to output the corrected next state count value and the count correction select control signal.

In another example, the apparatus includes in which the seconds reference circuit further includes a comparator that compares the current state output of the counter to a count value corresponding to approximately one second.

In still another example, the apparatus includes the reference clock that has a nominal operating frequency of 32 kHz. In yet a further example, in the apparatus, the seconds reference circuit further includes a comparator that compares the current state output of the counter to a count value. In another example, in the apparatus the seconds reference output signal is output by a comparator that compares the count value to 32,767.

In still a further example, the apparatus includes the counter including flip flops clocked by the reference clock. In another example, the apparatus includes the calibration compensation circuit that is further coupled to receive a compensation value.

In yet another example, the apparatus includes the corrected next state count value that is increased to a value greater than the current state output of the counter, responsive to a compensation value and the compensate up down input signal.

In another example, the apparatus includes the corrected next state that is set to the value of the current state output of the counter, responsive to the compensate up down input signal. In a further example, in the apparatus, the compensation value is an 8 bit value.

In another described example, an integrated circuit includes: a microprocessor coupled to an address bus and a data bus; a plurality of memory blocks coupled to the address bus and the data bus, and storing instructions that can be executed by the microprocessor; a real-time clock circuit coupled to the address bus and to the data bus, the real-time clock circuit further including: a real-time clock seconds counter, coupled to a seconds reference signal, and counting seconds responsive to a reference clock input; a real-time clock minutes counter, coupled to the real-time clock seconds counter and counting minutes responsive to the reference clock input; and a real-time clock hours counter, coupled to the real-time clock minutes counter and counting hours responsive to the reference clock input. The integrated circuit further includes: a real-time clock prescaler circuit outputting the seconds reference signal, further including: a counter configured to output a current state count value, having a next state input, and clocked by a clock based on a reference clock; a multiplexer coupled to the counter and configured to output the next state input, configured to output one of an incremented next state value and a corrected next state value, responsive to a count correction select signal; a seconds reference circuit coupled to the output of the counter and to a count value and configured to output the seconds reference signal; an incrementer coupled to the counter, configured to output the incremented next state value; and a calibration compensation circuit coupled to the counter, and coupled to receive a compensation value and a compensate up down input signal, and coupled to the reference clock input, configured to output the corrected next state value and the count correction select signal.

In a further example, the integrated circuit includes the real-time clock prescaler circuit that further includes the counter that is a 15 bit register clocked by the reference clock.

In another alternative example, the integrated circuit includes the reference clock that is coupled to an external crystal oscillator. In still another example, in the integrated circuit, the reference clock has a frequency of 32 kHz.

In yet another example, in the integrated circuit, the calibration compensation circuit outputs the corrected next state value that is increased above the current state count value, responsive to the compensate up down input. In still another example, in the integrated circuit, the calibration compensation circuit outputs the corrected next state value that is maintained at the current state count value, responsive to the compensate up down input signal.

In still a further example, in the integrated circuit, the multiplexer outputs the incremented state value that is the current state count value increased by one, responsive to the count correction select signal. In yet another example, in the integrated circuit, the seconds reference circuit outputs the seconds reference signal when the current state value equals 32,767.

In an example method, the method includes receiving a reference clock; updating a counter with a next state count value responsive to the reference clock; determining if a seconds reference condition is met, and outputting a seconds reference signal responsive to the determining; determining if a compensate up down signal is present; setting the next state count value to an incremented current state of the counter responsive to the compensate up down signal not being present; determining if a compensation value is greater than zero; setting the next state count value to a current count value of the counter responsive to the compensate up down signal being present and the compensation value being zero; and setting the next state count value to a current count value of the counter adjusted positively by an adjustment value responsive to the compensate up down signal being present and the compensation value being non zero. In a further example method, the method repeats.

Modifications are possible in the described embodiments, and other embodiments are possible within the scope of the claims.

What is claimed is:

1. An apparatus, comprising:
a counter configured to receive a reference clock signal and having a next state input and a current state output;
a multiplexer coupled to the next state input of the counter, configured to output one of an incremented next state value and a corrected next state count value responsive to a count correction select control signal;
a seconds reference circuit coupled to the counter, configured to output a seconds reference signal;
an incrementer coupled to the current state output of the counter, configured to output the incremented next state value; and
a calibration compensation circuit coupled to a compensate up down input signal and to the current state output of the counter, configured to output the corrected next state count value and the count correction select control signal.

2. The apparatus of claim 1, in which the seconds reference circuit further includes a comparator configured to compare the current state output of the counter to a count value corresponding to approximately one second.

3. The apparatus of claim 2, in which the seconds reference circuit further includes the comparator configured to compare the current state output of the counter to a count value of 32,767.

4. The apparatus of claim 2, in which the reference clock signal has a nominal operating frequency of 32 kHz.

5. The apparatus of claim 1, in which the seconds reference circuit is configured to output the seconds reference signal at approximately 1 second intervals.

6. The apparatus of claim 1, in which the counter includes a register including a plurality of flip flops clocked by a clock based on the reference clock signal.

7. The apparatus of claim 1, in which the calibration compensation circuit is further coupled to receive a compensation value.

8. The apparatus of claim 1, in which the corrected next state count value is increased to a value greater than the current state output of the counter responsive to a compensation value and the compensate up down input signal.

9. The apparatus of claim 8, in which the compensation value is an 8 bit value.

10. The apparatus of claim 1, in which calibration compensation circuit is configured to output the corrected next state count value equal to the current state output of the counter, responsive to the compensate up down input signal.

11. An integrated circuit, comprising:
a microprocessor coupled to an address bus and a data bus;
a plurality of memory blocks coupled to the address bus and the data bus, and storing instructions that can be executed by the microprocessor;
a real-time clock circuit coupled to the address bus and to the data bus, the real-time clock circuit further including:
a real-time clock seconds counter, coupled to a seconds reference signal, and counting seconds responsive to a reference clock input signal;
a real-time clock minutes counter, coupled to the real-time clock seconds counter and counting minutes responsive to the reference clock input signal;
a real-time clock hours counter, coupled to the real-time clock minutes counter and counting hours responsive to the reference clock input signal;
a real-time clock prescaler circuit outputting the seconds reference signal, further including:
a counter configured to output a current state count value, having a next state input, and clocked by a clock based on a reference clock signal;
a multiplexer coupled to the counter and configured to output the next state input, configured to output one of an incremented next state value and a corrected next state value, responsive to a count correction select signal;
a seconds reference circuit coupled to the output of the counter and to a count value and configured to output the seconds reference signal;
an incrementer coupled to the counter, configured to output the incremented next state value; and
a calibration compensation circuit coupled to the counter, and coupled to receive a compensation value and a compensate up down input signal, and coupled to the reference clock input signal, configured to output the corrected next state value and the count correction select signal.

12. The integrated circuit of claim 11, in which the real-time clock prescaler circuit further includes a 15 bit register clocked by the reference clock input signal forming the counter.

13. The integrated circuit of claim 11, in which the reference clock input signal is coupled to an external crystal oscillator.

14. The integrated circuit of claim 13, in which the external crystal oscillator has a frequency of 32 kHz.

15. The integrated circuit of claim 11, in which the calibration compensation circuit is configured to output the corrected next state value that is increased above the current state count value, responsive to the compensate up down input.

16. The integrated circuit of claim 11, in which the calibration compensation circuit is configured to output the corrected next state value that is maintained at the current state count value responsive to the compensate up down input signal.

17. The integrated circuit of claim 11, in which the multiplexer is configured to output the next state input that is the incremented next state value that equals the current state count value increased by one, responsive to the count correction select signal.

18. The integrated circuit of claim 11, in which the seconds reference circuit is configured to output the seconds reference signal when the output of the counter equals 32,767.

19. A method, comprising:
receiving a reference clock signal;
updating a counter with a next state count value responsive to the reference clock signal;
determining if a seconds reference condition is met, and outputting a seconds reference signal responsive to the determining;
determining if a next reference clock cycle is a potential correction event;
determining a logic state of a compensate up down signal;
setting the next state count value to an incremented current state of the counter responsive to the logic state of the compensate up down signal;
determining if a compensation value is greater than zero;
setting the next state count value to a current count value of the counter responsive to the compensate up down signal indicating a down compensation and the compensation value being zero; and
setting the next state count value to a current count value of the counter adjusted positively by an adjustment value, responsive to the compensate up down signal being present and the compensation value being non zero.

20. The method of claim 19, in which the method repeats.

* * * * *